(12) United States Patent
Zhang

(10) Patent No.: US 12,089,441 B2
(45) Date of Patent: Sep. 10, 2024

(54) DISPLAY PANEL AND DISPLAY DEVICE

(71) Applicant: KunShan Go-Visionox Opto-Electronics Co., Ltd, Jiangsu (CN)

(72) Inventor: Zhiyuan Zhang, Kunshan (CN)

(73) Assignee: KunShan Go-Visionox Opto-Electronics Co., Ltd, Kunshan (CN)

( * ) Notice: Subject to any disclaimer, the term of this patent is extended or adjusted under 35 U.S.C. 154(b) by 414 days.

(21) Appl. No.: 17/500,152

(22) Filed: Oct. 13, 2021

(65) Prior Publication Data

US 2022/0037422 A1 Feb. 3, 2022

Related U.S. Application Data

(63) Continuation of application No. PCT/CN2020/086099, filed on Apr. 22, 2020.

(30) Foreign Application Priority Data

Oct. 30, 2019 (CN) .......................... 201911044296.6

(51) Int. Cl.
*H10K 59/121* (2023.01)
*H10K 59/65* (2023.01)
*H10K 59/88* (2023.01)

(52) U.S. Cl.
CPC .......... *H10K 59/121* (2023.02); *H10K 59/65* (2023.02); *H10K 59/88* (2023.02)

(58) Field of Classification Search
CPC .... H10K 59/121; H10K 59/65; H10K 59/352; H10K 59/353; H10K 59/88; G09G 2300/0452
See application file for complete search history.

(56) References Cited

U.S. PATENT DOCUMENTS 11,562,680 B2 * 1/2023 Li .......................... G09G 3/2074
11,587,492 B2 * 2/2023 Li .......................... G09G 3/2074
(Continued)

FOREIGN PATENT DOCUMENTS

CN 101401143 A 4/2009
CN 101571670 A 11/2009
(Continued)

OTHER PUBLICATIONS

The International search report for PCT Application No. PCT/CN2020/086099, dated Jul. 29, 2020, 8 pages.
(Continued)

*Primary Examiner* — Mamadou L Diallo
(74) *Attorney, Agent, or Firm* — Maier & Maier, PLLC

(57) ABSTRACT

A display panel and a display device. The first display region of the display panel includes a first boundary on a side of the display panel, the second display region includes a second boundary on the same side and is connected with the first boundary, and the display panel includes a first pixel unit which is located in the first display region and includes a plurality of first sub-pixels of different colors. A second pixel unit which is located in the second display region and includes a plurality of second sub-pixels of different colors, and dummy sub-pixels which are located in the first display region and between the first pixel unit and the first boundary. A color of the dummy sub-pixels is the same as that of the second sub-pixels in the second pixel unit adjacent to the second boundary.

20 Claims, 3 Drawing Sheets

(56) References Cited

U.S. PATENT DOCUMENTS

| | | | | |
|---|---|---|---|---|
| 2013/0308073 | A1 | 11/2013 | Yamazaki et al. | |
| 2019/0221179 | A1* | 7/2019 | Chen | H01L 27/124 |
| 2020/0279892 | A1* | 9/2020 | Chen | G09G 3/3225 |
| 2020/0312832 | A1* | 10/2020 | Chi | H10K 59/353 |
| 2020/0365102 | A1* | 11/2020 | Chang | G02F 1/136209 |
| 2020/0380915 | A1* | 12/2020 | Yoon | G09G 3/3225 |
| 2021/0057494 | A1* | 2/2021 | Chung | H10K 59/121 |
| 2021/0217821 | A1* | 7/2021 | Han | G09G 3/3208 |
| 2021/0327972 | A1* | 10/2021 | Lou | H10K 59/353 |
| 2021/0376011 | A1* | 12/2021 | Liu | H10K 59/353 |
| 2021/0384270 | A1* | 12/2021 | Liu | H10K 59/122 |
| 2022/0199011 | A1* | 6/2022 | Ka | G09G 3/3275 |
| 2023/0326387 | A1* | 10/2023 | Li | H10K 59/121 |
| | | | | 345/694 |

FOREIGN PATENT DOCUMENTS

| | | | |
|---|---|---|---|
| CN | 105741774 A | 7/2016 | |
| CN | 107610635 A | 1/2018 | |
| CN | 108269840 A | 7/2018 | |
| CN | 108461521 A | 8/2018 | |
| CN | 108564887 A | 9/2018 | |
| CN | 108666348 A | 10/2018 | |
| CN | 108766990 A | 11/2018 | |
| CN | 208507679 U | 2/2019 | |
| CN | 109755282 A | 5/2019 | |
| CN | 109950288 A | 6/2019 | |
| CN | 109962092 A * | 7/2019 | ........... H01L 25/167 |
| CN | 110071161 A | 7/2019 | |
| CN | 209056269 U | 7/2019 | |
| CN | 110112189 A * | 8/2019 | .......... H01L 27/3211 |
| CN | 110289296 A | 9/2019 | |
| CN | 110289298 A | 9/2019 | |
| CN | 110392146 A | 10/2019 | |
| CN | 110782807 A | 2/2020 | |
| TW | 201839977 A | 11/2018 | |
| WO | 2019199139 A1 | 10/2019 | |

OTHER PUBLICATIONS

The First Office Action for Chinese Application No. 201911044296.6, dated Jun. 19, 2020, 7 pages.

* cited by examiner

DISPLAY PANEL AND DISPLAY DEVICE

CROSS REFERENCE TO RELATED DISCLOSURE

This application is a continuation of International Application No. PCT/CN2020/086099 filed on Apr. 22, 2020 and entitled "DISPLAY PANEL AND DISPLAY DEVICE", which claims priority to Chinese Patent Application No. 201911044296.6, filed on Oct. 30, 2019, both of which are hereby incorporated by reference in their entireties.

TECHNICAL FIELD

The present disclosure relates to a technical field of display, and particularly relates to a display panel and a display device.

BACKGROUND

High screen-to-body ratio is the latest development direction of smart electronic products. In order to increase the screen-to-body ratio, various sensors in the front of the electronic products need to be integrated under a display panel. At present, a fingerprint identifier, an earpiece and other means can be well integrated under the display panel, but the integration of a front camera of the electronic product is still a problem.

With respect to the integration of the front camera, the current solution is to dig a groove or punch a hole at a position of the display panel corresponding to the camera, but this will cause a problem that information cannot be displayed on the grooved or punched region of the display panel.

SUMMARY

The present disclosure provides a display panel and a display device, which can realize display on a region of the display panel where a photosensitive component is integrated.

In one aspect, an embodiment of the present disclosure provides a display panel including a first display region and a second display region adjacent to each other, a light transmittance of the first display region is different from that of the second display region, the first display region includes a first boundary on a side of the display panel, the second display region includes a second boundary on the same side and connected with the first boundary, and the display panel includes a first pixel unit which is located in the first display region and includes a plurality of first sub-pixels of different colors; a second pixel unit which is located in the second display region and includes a plurality of second sub-pixels of different colors, and dummy sub-pixels located in the first display region and between the first pixel unit and the first boundary, wherein a color of the dummy sub-pixels is the same as that of the second sub-pixels in the second pixel unit adjacent to the second boundary.

According to the display panel of the embodiments of the present disclosure, the light transmittance of the first display region of the display panel is different from that of the second display region, whereby a photosensitive component may be integrated in the display panel on the back of one of the display regions, thereby realizing integration of the photosensitive component, for example, the camera, under the screen and also displaying images on both of the first display region and the second display region, which increases the display area of the display panel and realizes the full-screen design of the display device. The display panel includes the dummy sub-pixels which are located between the first pixel unit and the first boundary, and the color of the dummy sub-pixels is the same as that of the second sub-pixels in the second pixel unit adjacent to the second boundary, whereby the colors displayed along the boundaries on the same side of the display panel are consistent, thereby eliminating the color cast of the boundaries due to the two-color contrast and improving the display effect.

According to the foregoing embodiments of an aspect of the present disclosure, the plurality of dummy sub-pixels are arranged between the first pixel unit and the first boundary along a direction parallel to the first boundary, whereby distances between the plurality of dummy sub-pixels and the first boundary are uniform.

According to any one of the foregoing embodiments of an aspect of the present disclosure, the plurality of dummy sub-pixels are disposed to be flush with the plurality of second sub-pixels in the second display region adjacent to the second boundary.

Since the plurality of dummy sub-pixels are disposed to be flush with the plurality of second sub-pixels in the second display region adjacent to the second boundary, when the display panel displays a monochrome image having the same color as that of the dummy sub-pixels, its display boundaries are flush, thereby preventing a phenomenon in which a part of the boundaries of the display panel is convex or concave during the monochrome display.

In another aspect, an embodiment of the present disclosure provides a display device, which includes the display panel of any one of the foregoing embodiments.

According to the display panel and the display device of the embodiments of the present disclosure, the light transmittance of the first display region of the display panel is different from that of the second display region, whereby a photosensitive component may be integrated in the display panel on the back of one of the display regions, thereby realizing integration of the photosensitive component, for example, the camera, under the screen and also displaying images on both of the first display region and the second display region, which increases the display area of the display panel and realizes a full-screen design of the display device. The display panel includes the dummy sub-pixels which are located between the first pixel unit and the first boundary, and the color of the dummy sub-pixels is the same as that of the second sub-pixels in the second pixel unit adjacent to the second boundary, whereby the colors displayed along the boundaries on the same side of the display panel are consistent, thereby eliminating the color cast of the boundaries due to the two-color contrast and improving the display effect.

BRIEF DESCRIPTION OF THE DRAWINGS

By reading the following detailed description of the non-limiting embodiments with reference to the accompanying drawings, other features, objections, and advantages of the present disclosure will become more apparent, wherein the same or similar reference signs indicate the same or similar features, and the drawings are not drawn to actual scale.

DETAILED DESCRIPTION

In order to make the objections, technical solutions, and advantages of the disclosure clear, the present disclosure is further described in detail below in combination with the accompanying drawings and specific embodiments. It should be understood that the specific embodiments described herein are only configured to explain but not to limit the present disclosure. For those skilled in the art, the present disclosure can be implemented without some of these specific details.

It should be noted that relationship terms herein such as first and second are only used to distinguish one entity or operation from another entity or operation and do not necessarily require or imply any actual relationship or order to be present between these entities or operations.

In a smart electronic apparatus such as a mobile phone and a tablet computer, it is necessary to integrate a photosensitive component such as a front camera, an infrared light sensor, and a proximity light sensor on a side where a display panel is disposed. In some embodiments, a transparent display region may be disposed in the above-mentioned electronic apparatus, and the photosensitive component may be disposed under the transparent display region, thereby realizing a full-screen display of the electronic apparatus while the normal operation of the photosensitive component is ensured.

In the display panel including the transparent display region, a pixel arrangement structure of the transparent display region is usually different from that of an opaque display region, the color of sub-pixels in the transparent display region adjacent to a boundary on a side of the display panel is different from that of sub-pixels in the opaque display region adjacent to a boundary on the same side, whereby the color cast due to the two-color contrast will be generated along the boundaries of the transparent region and the opaque region on the same side, thereby affecting the display effect.

In order to solve the above-mentioned problem, the embodiments of the present disclosure provide a display panel and a display device, and various embodiments of the display panel and the display device will be described below in combination with the accompanying drawings.

An embodiment of the present disclosure provides a display panel, which may be an organic light emitting diode (OLED) display panel. Hereinafter, the display panel of the embodiments of the present disclosure will be described in detail in combination with the accompanying drawings.

Figure 1:
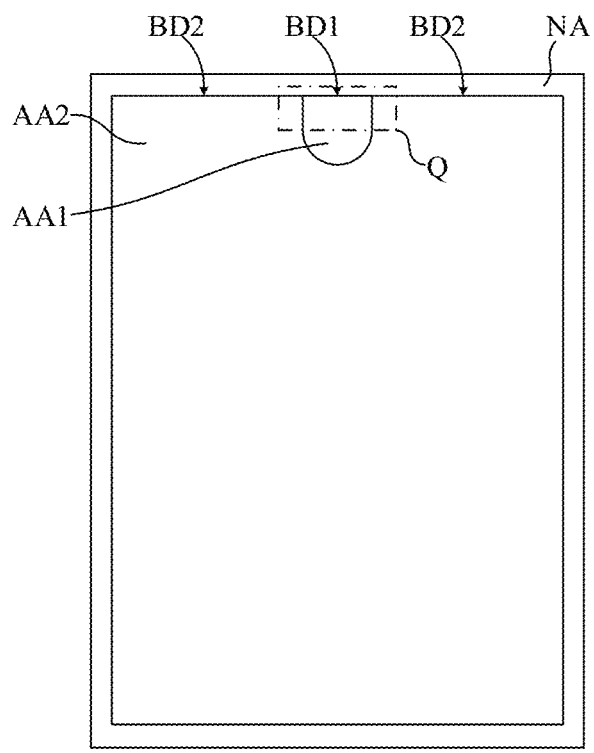
FIG. 1 is a schematic top view of a display panel provided according to an embodiment of the present disclosure.
Figure 2:
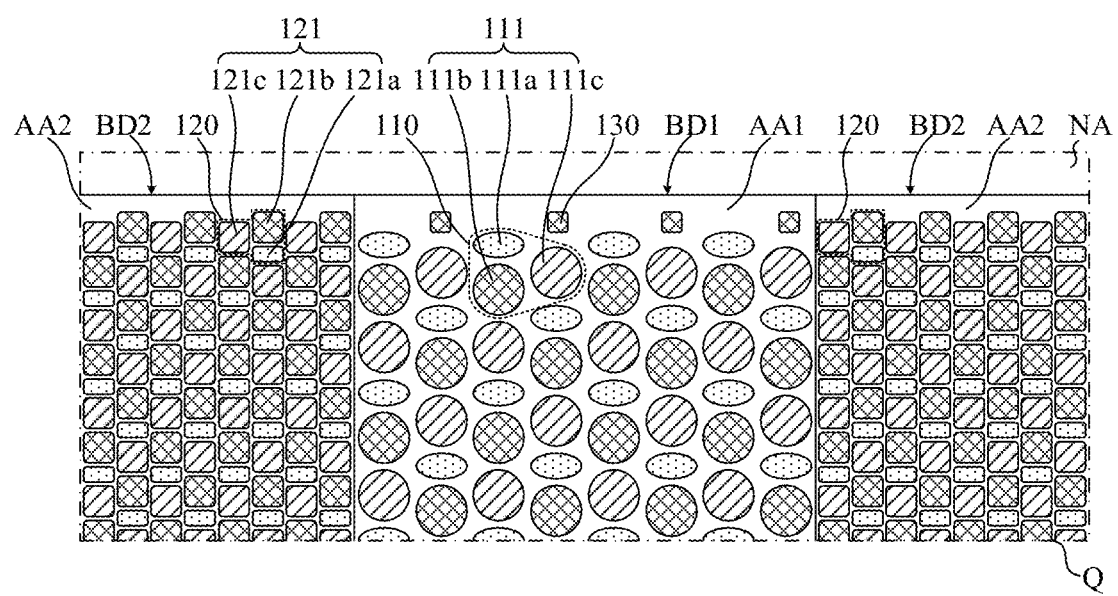
FIG. 2 is a partial enlarged view of a region Q of the display panel provided according to an embodiment of the present disclosure in FIG. 1.

FIG. 1 is a schematic top view of a display panel provided according to an embodiment of the present disclosure, and FIG. 2 is a partial enlarged view of a region Q of a display panel provided according to an embodiment of the present disclosure in FIG. 1. The display panel 100 includes a first display region AA1 and a second display region AA2 adjacent to each other, and a light transmittance of the first display region AA1 is different from that of the second display region AA2. In some embodiments, the display panel 100 further includes a non-display region NA surrounding the outer periphery of the whole of the first display region AA1 and the second display region AA2. The first display region AA1 and the second display region AA2 together form a display region of the display panel 100.

Herein, the light transmittance of one of the first display region AA1 and the second display region AA2 is equal to or larger than 15%.

According to the display panel 100 of an embodiment of the present disclosure, the light transmittance of the first display region AA1 of the display panel 100 is different from that of the second display region AA2, whereby the photosensitive component may be integrated in the display panel 100 on the back of one of the display regions, thereby realizing integration of the photosensitive component, for example, the camera, under the screen and also displaying images on both of the first display region AA1 and the second display region AA2, which increases the display area of the display panel 100 and realizes a full-screen design of the display device.

The first display region AA1 includes a first boundary BD1, and the second display region AA2 includes a second boundary BD2 on the same side as and connected with the first boundary BD1. The first boundary BD1 and the second boundary BD2 are connected to form at least a portion of a continuous boundary of the whole display region.

The display panel 100 includes a first pixel unit 110 and a second pixel unit 120. The first pixel unit 110 is located in the first display region AA1 and includes a plurality of first sub-pixels 111 of different colors, that is, the first pixel unit 110 includes the plurality of first sub-pixels 111 which can be divided into multiple types according to the different colors. The second pixel units 120 is located in the second display region AA2 and includes a plurality of second sub-pixels 121 of different colors, that is, the second pixel units 120 includes a plurality of second sub-pixels 121 which can be divided into multiple types according to the different colors.

Optionally, the first sub-pixels 111 includes, for example, a red first sub-pixel 111a, a green first sub-pixel 111b, and a blue first sub-pixel 111c which are arranged in the first display region AA1 in a predetermined order so as to form a first pixel arrangement structure. Also, the second sub-pixels 121 may include a red second sub-pixel 121a, a green second sub-pixel 121b, and a blue second sub-pixel 121c which are arranged in the second display region AA2 in a predetermined order so as to form a second pixel arrangement structure.

Each first pixel unit 110 includes one red first sub-pixel 111a, one green first sub-pixel 111b, and one blue first sub-pixel 111c which are in a triangular arrangement in the first pixel unit 110. Each second pixel units 120 includes one red second sub-pixel 121a, one green second sub-pixel 121b, and a blue second sub-pixel 121c which are in a triangular arrangement in the second pixel unit 120.

The display panel 100 further includes dummy sub-pixels 130 which are located in the first display region AA1. The dummy sub-pixels 130 is located between the first pixel unit 110 and the first boundary BD1, and the color of the dummy sub-pixels 130 is the same as that of the second sub-pixels 121 of the second pixel unit 120 adjacent to the second boundary BD2. For example, the second sub-pixels 121 of the second pixel units 120 adjacent to the second boundary BD2 are green second sub-pixels 121b, and the dummy sub-pixels 130 are also green sub-pixels.

According to the display panel 100 and the display device of an embodiment of the present disclosure, the color of the dummy sub-pixels 130 is the same as that of the second sub-pixels 121 of the second pixel unit 120 adjacent to the second boundary BD2, whereby the colors displayed along the boundaries of the display panel 100 on the same side are consistent, thereby eliminating the color cast of the boundaries due to the two-color contrast and improving the display effect. In some embodiments, the dummy sub-pixels 130 are provided, so the sub-pixels of the display panel 100 adjacent to the first boundary BD1 and the second boundary BD2 have the same color, whereby the color cast problem of the boundaries of the display region of the display panel is greatly improved in combination with the optimization of the color cast by a driver chip.

Optionally, the plurality of dummy sub-pixels 130 are arranged between the first pixel unit 110 and the first boundary BD1 along a direction parallel to the first boundary BD1, whereby distances between the plurality of dummy sub-pixels 130 and the first boundary BD1 are uniform.

Optionally, the dummy sub-pixels 130 and the adjacent first sub-pixels 111 in the adjacent first pixel unit 110 have different colors. For example, when the dummy sub-pixels 130 are green sub-pixels, and the adjacent first sub-pixels 111 in the adjacent first pixel unit 110 are red or blue.

The light transmittance of the first display region AA1 is larger than that of the second display region AA2, whereby the first display region AA1 can be used as a transparent display region, and the photosensitive component can be integrated on the back of the first display region AA1. In some embodiments, the second display region AA2 is disposed surround a portion of the periphery of the first display region AA1, whereby each of the two ends of the first boundary BD1 is connected with the second boundary BD2. It can be understood that in some other embodiments, the light transmittance of the second display region AA2 may be larger than the light transmittance of the first display region AA1.

Figure 3:
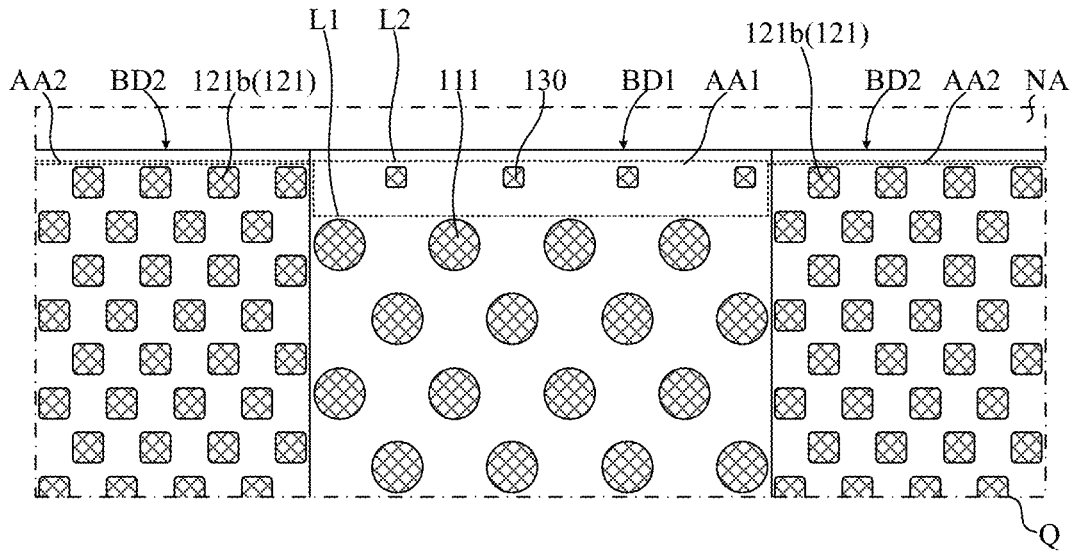
FIG. 3 is a partial enlarged view of a region Q in FIG. 1 when the display panel provided according to an embodiment of the present disclosure displays a monochrome image.

FIG. 3 is a partial enlarged view of a region Q in FIG. 1 when the display panel provided according to an embodiment of the present disclosure displays a monochrome image, the color of which is the same as that of the dummy sub-pixels 130 and is, for example, green.

In FIG. 3, a first monochrome display boundary line L1, which is formed by the first display region AA1 and the second display region AA2 when the dummy sub-pixels 130 is not disposed in the display panel, and a second monochrome display boundary line L2, which is formed by the first display region AA1 and the second display region AA2 after the dummy sub-pixels 130 are disposed in the display panel, are each shown by the dotted lines. As shown in FIG. 3, when the dummy sub-pixels 130 are not disposed in the display panel, the first monochrome display boundary line L1 is concave (or convex).

The plurality of dummy sub-pixels 130 are flush with the plurality of second sub-pixels 121 of the second display region AA2 adjacent to the second boundary BD2, whereby when the display panel 100 displays a monochrome image having the same color as that of the dummy sub-pixels 130, the display boundaries are flush, that is, the second monochrome display boundary line L2 formed by the first display region AA1 and the second display region AA2 is a straight line, thereby preventing a phenomenon in which a portion of the boundaries of the display panel is convex or concave during the monochrome display.

Optionally, the first pixel unit 110 includes the first sub-pixels 111 of the same color as that of the dummy sub-pixels 130, and the size of the dummy sub-pixels 130 is smaller than that of the first sub-pixels 111 of the same color. In some embodiments, the size of the second sub-pixels 121 is smaller than that of the first sub-pixels 111 of the same color. In some embodiments, the size of the dummy sub-pixels 130 is also smaller than that of the second sub-pixels 121 of the same color.

Herein, a size of a certain part refers to a size of the area occupied by all structures included (or designed) by the part on the display surface of the display panel 100.

The size of the first pixel unit 110 may be larger than that of the second pixel units 120.

As described above, the plurality of first sub-pixels 111 in the first display region AA1 are arranged so as to form a first pixel arrangement, and the plurality of second sub-pixels 121 in the second display region AA2 are arranged so as to form a second pixel arrangement. In some embodiments, the order of arrangement of colors of the plurality of first sub-pixels 111 in the first pixel arrangement is different from that of the plurality of second sub-pixels 121 in the second pixel arrangement. In some embodiments, the order of arrangement of colors of the plurality of first sub-pixels 111 in the first pixel arrangement is reversed with respect to that of the plurality of second sub-pixels 121 in the second pixel arrangement. Specifically, the plurality of first sub-pixels 111 in the first pixel arrangement and the plurality of second sub-pixels 121 in the second pixel arrangement are each arranged in multiple rows or multiple columns, and the order of arrangement of colors of the first sub-pixels 111 in each row of the first sub-pixels 111 is reversed with respect to that of the second sub-pixels 121 in each row of the second sub-pixels 121, or the order of arrangement of colors of the first sub-pixels 111 in each column of the first sub-pixels 111 is reversed with respect to that of the second sub-pixels 121 in each column of the second sub-pixels 121.

In the first pixel arrangement, the plurality of first sub-pixels 111 are arranged in multiple columns, and in each column of the first sub-pixels 111, the first sub-pixel 111 of the first color, the first sub-pixel 111 of the second color, and the first sub-pixel 111 of the third color are arranged in order, periodically and repeatedly, for example, the red first sub-pixel 111a, the green first sub-pixel 111b, and the blue first sub-pixel 111c are arranged in order, periodically and repeatedly. The first sub-pixels 111 in $N^{th}$ and $N+1^{th}$ columns are misaligned, and N is an integer equal to or larger than 1.

In the second pixel arrangement, the plurality of second sub-pixels 121 are arranged in multiple columns, and in each column of the second sub-pixels 121, the second sub-pixels 121 of the third color, the second sub-pixels 121 of the second color, and the second sub-pixels 121 of the first color are arranged in order, periodically and repeatedly, for example, the blue second sub-pixel 121c, the green second sub-pixel 121b, and the red second sub-pixel 121a are arranged in order, periodically and repeatedly. The second sub-pixels 121 in the $M^{th}$ and $M+1^{th}$ columns are misaligned, and M is an integer equal to or larger than 1.

A mask used for vapor deposition of the sub-pixels is affected by the process during production, and a dummy vapor deposition opening is usually disposed at an edge, and in an embodiment of the present disclosure, the dummy sub-pixels 130 can be formed by vapor deposition at the dummy vapor deposition opening corresponding to the shape and structure. Based on the design of the display region of the original display panel 100, the above-mentioned dummy sub-pixels 130 are formed by adding the dummy pixel openings, thereby eliminating the color cast of the boundaries due to the two-color contrast at the display edge of the display panel. Since there is no need to modify the vapor deposition mask of the display panel, the cost can be greatly saved.

In the above-mentioned embodiment, the second sub-pixels 121 of the second pixel units 120 adjacent to the second boundary BD2 have one color. In some other embodiments, other forms can be provided.

Figure 4:
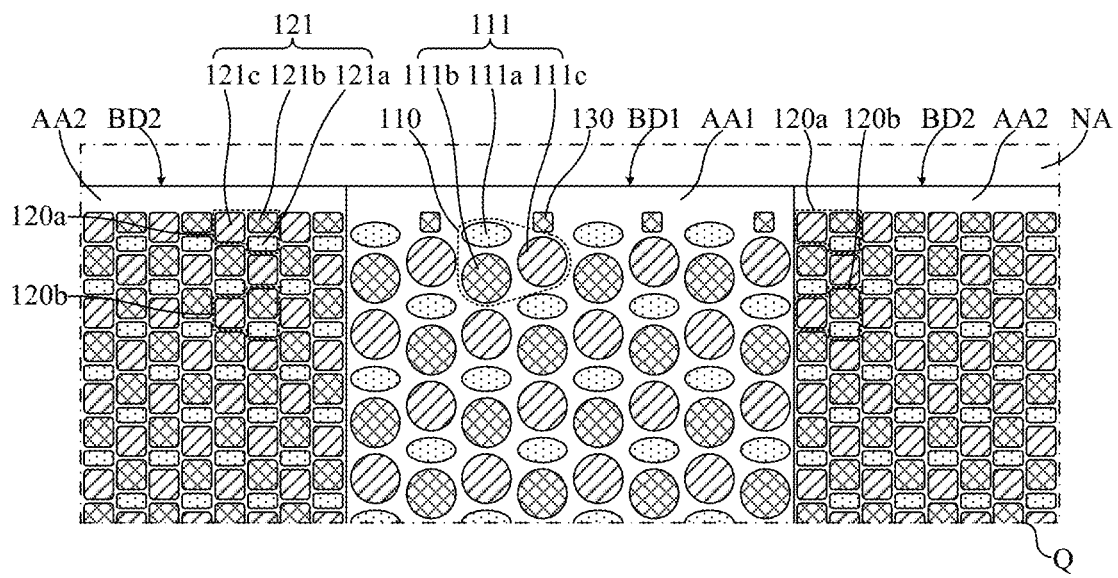
FIG. 4 is a partial enlarged view of a region Q of the display panel provided according to an alternative embodiment of the present disclosure in FIG. 1.

FIG. 4 is a partial enlarged view of a region Q of the display panel provided according to an alternative embodiment of the present disclosure in FIG. 1, wherein a portion of the structure in the alternative embodiment is the same as that of the previous embodiments, their differences will be described below, and the similarities are no longer described in detail.

The difference of the present disclosure from the foregoing embodiment is that the second pixel units includes a plurality of boundary pixel units 120a adjacent to the second boundary BD2 and a plurality of inner pixel units 120b on a side of the plurality of boundary pixel units 120a away from the second boundary BD2. The size of at least one second sub-pixel 121 in each boundary pixel units 120a is smaller than that of the second sub-pixels 121 in the inner pixel units 120b of the same color.

Optionally, the second sub-pixels 121 in the plurality of pixel units 120a adjacent to the second boundary BD2 have at least two colors and are disposed to be flush with the dummy sub-pixels 130, that is, the second sub-pixels 121 of at least two colors in the boundary pixel units 120 are adjacent to the second boundary BD2 and disposed to be flush with the dummy sub-pixels 130, and for example, in this embodiment, the second sub-pixels 121 of at least two colors in the boundary pixel units 120a are adjacent to the second boundary BD2 and disposed to be flush with the dummy sub-pixels 130. The color of the dummy sub-pixels 130 is the same as one of the colors of the second sub-pixels 121 of at least two colors.

According to the display panel of the above-mentioned alternative embodiment, the second sub-pixels 121 of more colors can be disposed to be flush with the dummy sub-pixels 130 by adjusting the size of a part of the second sub-pixels 121 in the boundary pixel units 120a, thereby eliminating the jagged first boundary BD1 and second boundary BD2 when the display panel displays and improving the display effect.

An embodiment of the present disclosure also provides a display device, which may include the display panel 100 of any one of the above-mentioned embodiments. A display device of an embodiment will be taken as an example for description as below, and in this embodiment, the display device includes the display panel 100 of the above-mentioned embodiment.

Figure 5:
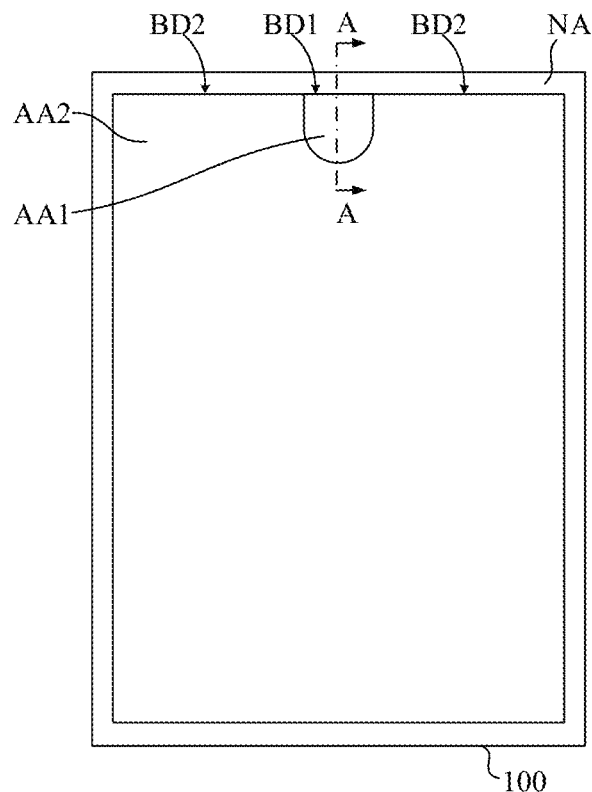
FIG. 5 is a schematic top view of a display device according to an embodiment of the present disclosure.
Figure 6:
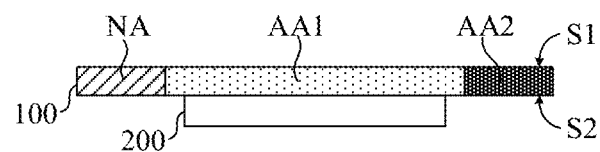
FIG. 6 is a cross-sectional view taken along a line A-A in FIG. 5.

FIG. 5 is a schematic top view of a display device provided according to an embodiment of the present disclosure, and FIG. 6 is a cross-sectional view taken along a line A-A in FIG. 5. In the display device of this embodiment, the display panel 100 may be the display panel 100 of one of the above-mentioned embodiments and has a first display region AA1 and a second display region AA2 in a plane parallel to a substrate, and a light transmittance of the first display region AA1 is different from that of the second display region AA2.

The display panel 100 includes a first surface S1 and a second surface S2 opposite to each other, and the second surface S1 is a display surface. The display device further includes a photosensitive component 200 located on a side where the second surface S2 of the display panel 100 is located, and in this embodiment, for example, the light transmittance of the first display region AA1 is larger than that of the second display region AA2 and the position of photosensitive the component 200 corresponds to that of the first display region AA1.

The photosensitive component 200 may be an image capturing device for capturing external image information. In this embodiment, the photosensitive component 200 is a complementary metal oxide semiconductor (CMOS) as the image capturing device, and also in some other embodiments, the photosensitive component 200 may be a charge-coupled device (CCD) as the image capturing device or other kinds of image capturing device. It can be understood that the photosensitive component 200 may not be limited to the image capturing device, and for example, in some embodiments, the photosensitive component 200 may also be an infrared sensor, a proximity sensor, or other light sensor.

According to the display device of an embodiment of the present disclosure, the light transmittance of the first display region AA1 of the display panel 100 is different from that of the second display region AA2, whereby the photosensitive component may be integrated in the display panel 100 on the back of one of the display regions, thereby realizing integration of the photosensitive component, for example, the camera, under the screen and also displaying images on both of the first display region AA1 and the second display region AA2, which increases the display area of the display panel 100 and realizes a full-screen design of the display device.

According to the display device of an embodiment of the present disclosure, the display panel 100 includes dummy sub-pixels 130 which are located between the first pixel unit 110 and the first boundary BD1, and the color of the dummy sub-pixels 130 is the same as that of the second sub-pixels 121 in the second pixel units 120 adjacent to the second boundary BD2, whereby the colors displayed along the boundaries on the same side of the display panel 100 are consistent, thereby eliminating the color cast of the boundaries due to the two-color contrast and improving the display effect.

In accordance with the embodiments of the present disclosure as described above, these embodiments neither exhaustively set forth all the details, nor limit the disclosure to the specific embodiments described. It will be apparent that many modifications and variations may be made according to the above description. These embodiments include been chosen and described in detail in the description so as to better explain the principle and actual application of the present disclosure, thereby enabling a person skilled in the art to make a better use of the present disclosure and make modifications based on the present disclosure. The present disclosure is limited merely by the claims and the whole scope and equivalent thereof.

What is claimed is:
1. A display panel comprising:
   a first display region comprising a first boundary on a side of the display panel; and
   a second display region, adjacent to the first display region, the second display region comprising a second boundary on the same side and connected with the first boundary, wherein a light transmittance of the first display region is different from a light transmittance of the second display region;

a first pixel unit located in the first display region that comprises a plurality of first sub-pixels of different colors;

a second pixel unit located in the second display region that comprises a plurality of second sub-pixels of different colors, wherein the second pixel unit comprises a plurality of boundary pixel units adjacent to the second boundary and a plurality of inner pixel units on a side of the plurality of boundary pixel units away from the second boundary; and dummy sub-pixels located in the first display region between the first pixel unit and the first boundary, wherein a color of the dummy sub-pixels is the same as a color of the second sub-pixels in the second pixel unit adjacent to the second boundary and all of the dummy sub-pixels are located in the first display region between the first pixel unit and the first boundary.

2. The display panel of claim 1, wherein the plurality of dummy sub-pixels is arranged between the first pixel unit and the first boundary in a direction parallel to the first boundary.

3. The display panel of claim 1, wherein each dummy sub-pixel of the plurality of dummy sub-pixels comprises a different color from that of the adjacent first sub-pixel in the adjacent first pixel unit.

4. The display panel of claim 1, wherein the light transmittance of the first display region is larger than the light transmittance of the second display region, and the second display region is disposed so as to surround a portion of a periphery of the first display region to make each of two ends of the first boundary connected with the second boundary.

5. The display panel of claim 2, wherein the plurality of dummy sub-pixels is disposed to be flush with the plurality of second sub-pixels in the second display region adjacent to the second boundary.

6. The display panel of claim 1, wherein a size of at least one of the second sub-pixels of a color in each boundary pixel units is smaller than a size of the second sub-pixels of the same color in the inner pixel units.

7. The display panel of claim 6, wherein the second sub-pixels in the plurality of boundary pixel units adjacent to the second boundary have at least two colors and are disposed to be flush with the dummy sub-pixels, and the color of the dummy sub-pixels is the same as one of the at least two colors of the second sub-pixels in the plurality of boundary pixel units adjacent to the second boundary.

8. The display panel according to claim 1, wherein the first pixel unit comprises the first sub-pixels of a color matching a color of the dummy sub-pixel, and a size of the dummy sub-pixels is smaller than that of the first sub-pixels of the same color.

9. The display panel of claim 8, wherein a size of the first pixel unit is larger than a size of the second pixel unit.

10. The display panel of claim 1, wherein the plurality of first sub-pixels in the first display region is arranged to form a first pixel arrangement, the plurality of second sub-pixels in the second display region is arranged to form a second pixel arrangement, and an order of arrangement of colors of the plurality of first sub-pixels in the first pixel arrangement is different from an order of arrangement of colors of the plurality of second sub-pixels in the second pixel arrangement.

11. The display panel of claim 10, wherein the order of arrangement of colors of the plurality of first sub-pixels in the first pixel arrangement is reversed with respect to the order of arrangement of colors of the plurality of second sub-pixels in the second pixel arrangement.

12. The display panel of claim 11, wherein, in the first pixel arrangement, the plurality of first sub-pixels is arranged in multiple columns, wherein in each column of the first sub-pixels, the first sub-pixel of a first color, the first sub-pixel of a second color, and the first sub-pixel of a third color are arranged in order, periodically and repeatedly, the first sub-pixels in $N^{th}$ and $N+1^{th}$ columns are misaligned, and N is an integer equal to or larger than 1; and in the second pixel arrangement, the plurality of second sub-pixels is arranged in multiple columns, wherein in each column of the second sub-pixels, the second sub-pixel of the third color, the second sub-pixel of the second color, and the second sub-pixel of the first color are arranged in order, periodically and repeatedly, the second sub-pixels in $M^{th}$ and $M+1^{th}$ columns are misaligned, and M is an integer equal to or larger than 1.

13. The display panel of claim 1, wherein the display panel is an organic light emitting diode display panel.

14. A display device comprising the display panel according to claim 1.

15. The display device of claim 14, wherein the display panel comprises a first surface and a second surface opposed to each other, the first surface is a display surface, and a light transmittance of the first display region is larger than a light transmittance of the second display region, and the display device further comprises:

a photosensitive component located on a side of the second surface and a position of the photosensitive component corresponds to a position of the first display region.

16. The display device of claim 14, wherein the photosensitive component is an image capturing device, an infrared sensor, or a proximity sensor.

17. The display panel of claim 1, wherein the first pixel unit comprises one red first sub-pixel, one green first sub-pixel, and one blue first sub-pixel which are in a triangular arrangement in the first pixel unit.

18. The display panel of claim 1, wherein the second pixel unit comprises one red second sub-pixel, one green second sub-pixel, and a blue second sub-pixel which are in a triangular arrangement in the second pixel unit.

19. A display panel comprising:

a first display region comprising a first boundary on a side of the display panel;

a second display region, adjacent to the first display region, the second display region comprising a second boundary on the same side of the display panel and connected with the first boundary, wherein a light transmittance of the first display region is different from a light transmittance of the second display region;

a first pixel unit located in the first display region that comprises a plurality of first sub-pixels of different colors;

a second pixel unit located in the second display region that comprises a plurality of second sub-pixels of different colors; and dummy sub-pixels located in the first display region between the first pixel unit and the first boundary, wherein a color of the dummy sub-pixels is the same as a color of the plurality of second sub-pixels in the second pixel unit adjacent to the second boundary, the plurality of dummy sub-pixels is arranged between the first pixel unit and the first boundary in a direction parallel to the first boundary, and the plurality of dummy sub-pixels is disposed to be flush with the plurality of second sub-pixels in the second display region adjacent to the second boundary.

20. The display panel of claim 19, wherein the plurality of second sub-pixels of the second pixel units adjacent to the second boundary has one color.

* * * * *